United States Patent [19]
Lu et al.

[11] Patent Number: 5,943,581
[45] Date of Patent: Aug. 24, 1999

[54] METHOD OF FABRICATING A BURIED RESERVOIR CAPACITOR STRUCTURE FOR HIGH-DENSITY DYNAMIC RANDOM ACCESS MEMORY (DRAM) CIRCUITS

[75] Inventors: Chih-Yuan Lu, Hsinchu; Janmye Sung, Yang Mei, both of Taiwan

[73] Assignee: Vanguard International Semiconductor Corporation, Hsin-Chu, Taiwan

[21] Appl. No.: 08/964,808

[22] Filed: Nov. 5, 1997

[51] Int. Cl.$^6$ .................. H01L 21/8242; H01L 21/70
[52] U.S. Cl. ................................. 438/386; 438/243
[58] Field of Search ..................... 438/386–392, 438/243–249

[56] References Cited

U.S. PATENT DOCUMENTS

| | | | |
|---|---|---|---|
| 4,397,075 | 8/1983 | Fatula, Jr. et al. | 29/571 |
| 4,853,348 | 8/1989 | Tsubouchi et al. | 437/203 |
| 4,896,293 | 1/1990 | McElroy | 365/149 |
| 5,017,504 | 5/1991 | Nishimura et al. | 437/40 |
| 5,064,777 | 11/1991 | Dhong et al. | 437/52 |
| 5,112,771 | 5/1992 | Ishii et al. | 437/67 |
| 5,213,999 | 5/1993 | Sparks et al. | 437/203 |
| 5,432,365 | 7/1995 | Chin et al. | 257/301 |
| 5,449,630 | 9/1995 | Lur et al. | 437/47 |
| 5,627,092 | 5/1997 | Alsmeier et al. | 438/152 |
| 5,629,226 | 5/1997 | Ohtsuki | 438/389 |
| 5,662,768 | 9/1997 | Rostoker | 257/301 |
| 5,843,820 | 12/1998 | Lu | 438/243 |

OTHER PUBLICATIONS

Ghandhi, "VLSI Fabrication Principles" 2$^{nd}$ ed, pub, by John Wiley & Sons, Inc, New York, pp. 741–742.

Primary Examiner—Olik Chaudhuri
Assistant Examiner—Daniel H. Mao
Attorney, Agent, or Firm—George O. Saile; Stephen B. Ackerman

[57] ABSTRACT

An improved DRAM cell using a novel buried reservoir capacitor is achieved. The method forms an array of N$^+$ doped regions in a substrate. P-wells are formed in an epitaxy layer on the substrate. A field oxide (FOX) is formed surrounding the device areas aligned over the N$^+$ regions. Holes are etched in the epi layer to the N$^+$ regions, and a selective wet etch removes the N$^+$ doped regions to form cavities. A thin dielectric layer is deposited on the cavity walls, and an N$^+$ polysilicon layer is deposited and polished back to form the buried reservoir capacitors. The N$^+$ polysilicon in the holes forms the capacitor node contacts for the FETs in the device areas. The array of DRAM cells is completed by growing a gate oxide, depositing and patterning a first polycide layer to form FET gate electrodes on the device areas over the capacitors, thereby providing increased capacitance while reducing the cell area. Lightly doped source/drain (LDD) areas, sidewall spacers and heavily doped source/drain contacts are formed for the FETs. A node strap is formed between one source/drain contact and the node contact to make good electrical contact. An insulating layer is deposited having bit line contact holes, and a second polycide layer is patterned to form the bit lines for the DRAM.

26 Claims, 3 Drawing Sheets

METHOD OF FABRICATING A BURIED RESERVOIR CAPACITOR STRUCTURE FOR HIGH-DENSITY DYNAMIC RANDOM ACCESS MEMORY (DRAM) CIRCUITS

RELATED PATENT APPLICATIONS

Ser. No. 09/163384 filed Sep. 30, 1998 entitled A NEW DYNAMIC RANDOM ACCESS MEMORY (DRAM) CELL HAVING A BURIED HORIZONTAL TRENCH CAPACITOR BY A NOVEL FABRICATION METHOD by C. Y. Lu

BACKGROUND OF THE INVENTION (1) Field of the Invention

This invention relates to an integrated circuit semiconductor device, and more particularly to a method for fabricating a new dynamic random access memory (DRAM) cell. The method utilizes a buried $N^+$ doped region in a silicon substrate which is removed by selective etching to form a cavity. The cavity wall is then coated with a dielectric layer and filled with a polysilicon to form a horizontally extending buried reservoir storage capacitor which increases capacitance.

(2) Description of the Prior Art

Dynamic random access memory (DRAM) devices are used for storing digital information on arrays of memory cells in the form of charge stored on a capacitor. Each memory cell consists of a single access transistor and a single storage capacitor. The access transistors are usually N-channel field effect transistors (FETs) and the FET gate electrodes are electrically connected by word lines to the peripheral address circuits. The storage capacitors are formed either by etching trenches in the substrate in each cell areas, commonly referred to as trench capacitors, or are formed over the access transistors in the cell areas by depositing and patterning conducting layers over the access transistors, and are commonly referred to as stacked capacitors. The capacitors make electrical contact to one of the two source/drain areas (node contact) of each FET (access transistor), while bit lines make electrical contact to the other source/drain area of each FET. Read/write circuits, on the periphery of the DRAM chip, are used to store binary data by charging or discharging the storage capacitor via the bit lines, and the binary data is read (or sensed) by peripheral sense amplifiers, also via the bit lines. However, each capacitor must lie within an area about the size of the cell area in order to accommodate all the capacitors in the large array of cells used on the DRAM device.

It is becoming increasingly difficult to fabricate more memory cells on a DRAM device, while limiting the overall DRAM device area to a practical size without decreasing the cell area. For example, after the year 2000 the number of memory cells is expected to reach multiple Gigabits. Further, as the cell area decreases, the available area for the storage capacitor in each cell also decreases. This makes it difficult to maintain sufficient capacitance for storing charge to provide the necessary signal-to-noise ratios. Also the refresh cycle time, necessary to maintain the required charge on these capacitors, also decreases, resulting in DRAM devices with reduced performance (speed).

One method in the semiconductor industry of overcoming the above problems is to form DRAM devices having stacked capacitors. These types of capacitors extend vertically upward (z-direction) over the access transistor and can be made with increased area (A) in the z-direction while maintaining or minimizing the area along the substrate surface (along the x-y directions). The two basic types of stacked capacitors for the DRAM cells of the prior art are the Capacitor Under Bit line (CUB) structure and the Capacitor Over Bit line (COB). However, in either the CUB or COB structure, the bit line and capacitor must share the same space on the memory cell area. More specifically, in the CUB structure the bit line contact must be formed in the same plane as the storage capacitor, and in the COB structure the node contact must be formed in the same plane as the bit line. For DRAM cells having submicrometer dimensions, it is becoming more difficult to maintain adequate separation between the bit line contact and the storage capacitor for the CUB structure, and between the node contact and bit line for the COB structure. This makes it difficult to fabricate reliable DRAM devices having stacked capacitors.

Also the topography on the DRAM device having stacked capacitors can be quite rough, and leveling and planarizing techniques are employed to provide a planar surface on which submicrometer structures (e.g., bit lines) can be reliably formed. These planar surfaces are needed to expose the high-resolution, distortion-free photoresist images (patterns) because of the shallow depth of focus (DOF) required for high-resolution exposures. Also planar surfaces are necessary to avoid residue (rails, fences, etc.) at steep steps when the next levels of conducting layers are anisotropically plasma etched. Another problem is the high aspect ratio (height/width) of the bit line contact holes that can result in high contact resistance.

An alternative method for making an array of DRAM cells is by forming deep trench capacitors in the silicon substrate. By forming the storage capacitors in a trench etched in the silicon substrate, it is possible to leave the surface on the substrate free for the bit lines, thereby providing adequate separation between bit line and storage capacitor. This also allows memory cells to be built with smaller surface areas for future high-density DRAM arrays.

One conventional trench capacitor DRAM cell is described by Ghandhi in "VLSI Fabrication Principles" second edition, pages 741–742, published by John Wiley & Sons, Inc., New York. In this method (FIG. 11.26(a)) a deep trench having vertical walls is etched in the a $P^+$ substrate having a P epitaxy layer. A thin insulating layer is formed on the trench sidewall, and a $P^+$ polysilicon fills the trench to form the storage capacitor. An N-well and a field oxide (FOX) are formed next to define and electrically isolate adjacent device areas. Word lines (which concurrently form the P-channel FET gate electrodes of the access transistors) are formed over the device areas adjacent to the trench capacitors. To increase capacitance two or more trench capacitors can be used, as shown in the DRAM cell design of FIG. 11.26(b). However, this requires additional substrate surface area and limits cell density.

There are several other process limitations for making the current trench capacitor DRAM cell. For example, to achieve sufficient storage capacitance as the cell area decreases, the capacitor trench must be etched very deep (e.g., having aspect ratios of 20 to 40) and is difficult to etch and fill with the polysilicon. For future ULSI requirements, the DRAM trench aspect ratio is expected to increase further. Another shortcoming of this conventional trench capacitor process is that the trench cannot be extended in the cell area under the FET to take advantage of the increased capacitor area derived therefrom.

Another approach is to extend trench capacitors under the FET (to save cell space) as described in Wolf, Vol. 2, pages 609, and depicted in FIGS. 8-24 and 8-25 on page 611. The structure is a Self-aligned Epitaxy Over Trench (SEOT) cell which uses a double epitaxy process. After forming a storage electrode ($P^+$ polysilicon node electrode) in a trench, that is completely isolated from the $P^+$ substrate, a selective epitaxy layer is laterally grown to form a single-crystal $P^-$ silicon over the $SiO_2$-isolated trench capacitor. However, the epitaxial growth is stopped before the epitaxy has completely grown over the trench to form a self-aligned window (opening). The $SiO_2$ in the window is etched to expose the $P^+$ polysilicon in the trench, and a second $P^-$ epitaxial layer is grown to form a pyramidal polysilicon in the window as the capacitor node contact for a P-channel FET memory cell. However, the multiple epitaxy is not cost effective; controlling the window size on 256 Mbit or 1 gigabit DRAM devices would be difficult to control; and the use of a $P^+$ storage electrode in a $P^+$ substrate is also more susceptible to leakage currents through the high-k dielectric.

Still other approaches to making trench capacitors with increased surface area are described in the prior art. For example Ohtsuki, U.S. Pat. No. 5,629,226, teaches a method for forming a buried (trench) capacitor in which an $N^+$ implant is formed at the bottom of the trench and annealed to diffuse into the silicon substrate. The annealed $N^+$ silicon is then selectively etched to increase the trench area and therefore the capacitance. Another approach for making deep trench capacitors for DRAM cells is described by Alsmeier et al., U.S. Pat. No. 5,627,092, in which vertical deep trench capacitors are made in a Silicon On Insulator (SOI). Another approach for increasing the capacitance of a vertical trench capacitor is taught by D. J. Chin et al. in U.S. Pat. No. 5,432,365. A high dopant concentration by ion implant is formed in the substrate to form one of the capacitor electrodes. This apparently further reduces the depletion layer in the substrate at the capacitor during charge storage and increases capacitance. Still another method is described by McElroy, U.S. Pat. No. 4,896,293, in which the access transistor is formed in one sidewall of the capacitor trench in which the FET source makes contact to the capacitor node plate while the FET drain is formed in the top surface of the substrate. This reduces surface area and increases cell density, but also requires a deeper trench to increase capacitance.

There is still a strong need in the semiconductor industry to further improve upon fabricating trench storage capacitors for DRAM cells with increased capacitance while minimizing the depth of the capacitor trench (decreased aspect ratio), and with improved reliability and manufacturing cost performance.

SUMMARY OF THE INVENTION

Accordingly, it is a principal object of this invention to provide a structure and a method for fabricating an array of dynamic random access memory (DRAM) cells having trench-like capacitors with increased capacitance.

It is another object to make these DRAM cells with increased capacitance by fabricating buried reservoir capacitors, horizontally extending under the FET (access transistor) to increase cell density on DRAM devices for future applications of high-density memory devices.

It is still another object of this invention to make these buried reservoir capacitors with an epitaxial layer grown thereon, which allows the FET gate electrodes and the shallow trench isolation regions to be built in and on the substrate over the capacitors, thereby increasing DRAM cell density.

In accordance with the present invention, an array of DRAM cells is formed, each DRAM cell having a buried reservoir capacitor. The buried reservoir capacitor extends laterally under the FET and under the field oxide (FOX), thereby increasing the capacitor area while avoiding the need to etch very deep trenches to minimize the cell area. The method utilizes an array of heavily $N^+$ doped regions in an N-doped single crystal silicon substrate, one $N^+$ doped region for each capacitor. An undoped epitaxy layer is grown on the substrate and after forming the FOX, node contact holes are etched in the epitaxy layer to the $N^+$ doped regions. The $N^+$ doped regions are then selectively etched to form cavities and the cavity walls are coated with a high dielectric constant (high-k) insulator. An $N^+$ doped polysilicon is deposited to coat the high-k insulator and is chemical/mechanically polished (CMP) back to form the capacitor node contacts. FETs are then formed over the buried reservoir capacitors to complete the array of DRAM cells.

More specifically, the method for making the array of DRAM cells having these improved capacitors on and in a silicon substrate begins by using a patterned first photoresist implant mask and an N type conductive ion implant to form an array of $N^+$ doped regions in the substrate. The first photoresist implant mask is removed, and a silicon epitaxy layer is grown on the substrate using chemical vapor deposition (CVD). An array of P-wells is formed in the silicon epitaxy layer aligned over the $N^+$ doped regions by using a patterned second photoresist implant mask. After removing the second photoresist implant mask, a pad oxide and a silicon nitride ($Si_3N_4$) layer are deposited. Conventional photolithographic techniques and anisotropic plasma etching are used to pattern the silicon nitride to form open areas in the $Si_3N_4$ where Field OXide (FOX) isolation regions are required. The field oxide isolation regions are then formed surrounding and electrically isolating device areas which are aligned over the $N^+$ doped regions. The FOX can be formed by the conventional LOCal Oxidation of Silicon (LOCOS) method using the $Si_3N_4$ as an oxidation barrier mask. Alternatively, more advanced planar isolation techniques can be used, such as shallow trench isolation (STI) to improve DRAM cell density. Holes are etched in the device areas using conventional photolithographic techniques and anisotropic plasma etching through the $Si_3N_4$ layer and the P-wells in the silicon epitaxy layer to the $N^+$ doped regions. The $N^+$ doped regions in the substrate are selectively removed using an isotropic wet etch to form an array of cavities in the substrate under the device areas. After removing the $Si_3N_4$ layer by etching, a thin capacitor insulating layer having a high dielectric constant is deposited to form an interelectrode dielectric layer on the surface of the cavities and on the sidewalls of the holes. A conformal doped polysilicon layer is deposited on the interelectrode dielectric layer on the surface of the cavities and to fill the holes. The doped polysilicon layer is chemical/mechanically polished back to the substrate surface to form the anode electrodes in the cavities and the anode contacts in the openings to complete the buried reservoir capacitors.

The partially completed structure having the array of buried reservoir capacitors is further processed to form a high-density array of DRAM cells. Continuing, a gate oxide is grown on the device areas. A first polycide layer is deposited and patterned to form the gate electrodes for the field effect transistors (FETs) on the device areas and extending over the buried reservoir capacitors. Also, the patterned first polycide layer forms word lines for the DRAM device over the field oxide isolation regions. Lightly doped source/drain areas are formed adjacent to the gate electrodes by ion implantation. A conformal insulating layer is deposited and etched back to form sidewall spacers on the gate electrodes. Source/drain contact areas are formed adjacent to the sidewall spacers by ion implantation to complete the FETs (access transistors) for the array of DRAM cells. The FETs are formed having one of the source/drain areas of each transistor extending over one of the anode electrical contacts of the buried reservoir capacitors. A conducting layer is deposited and patterned to form a node strap over the capacitor insulating layer (interelectrode dielectric) to form a good electrical connection between the source/drain area and the anode electrical contact. A polysilicon/metal dielectric (PMD) layer is deposited to insulate the FET gate electrodes and the source/drain areas. Bit line contact holes are etched in the PMD layer to the second of the source/drain areas of each FET, and a second polycide layer is deposited and patterned to form the bit lines to complete the array of DRAM cells having improved circuit density.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The novel DRAM cell structure and method for making a high-density array of DRAM cells having these novel buried reservoir capacitors is described in detail. The DRAM cells are formed using N-channel field effect transistors (N-FETs) as the access transistors in each of the memory cells formed in and on an epitaxial layer over the buried reservoir capacitors. This allows the invention to utilize the space under the device areas to make capacitors having increased capacitance while reducing the cell area. It should also be well understood by one skilled in the art that by including additional process steps, in addition to those described in this embodiment, other types of devices can also be included on the DRAM chip. For example, by forming N-doped well regions in the epitaxial layer on the substrate, P-channel FETs can also be provided from which Complementary Metal Oxide Semiconductor (CMOS) circuits can be formed, such as are used for the peripheral circuits on the DRAM chip.

FIGS. 1 through 7 show the processing steps for forming the novel buried reservoir capacitor for the DRAM cell and are described here in detail. FIG. 8 depicts the processing steps for forming a new DRAM cell using this novel storage capacitor.

Figure 1:
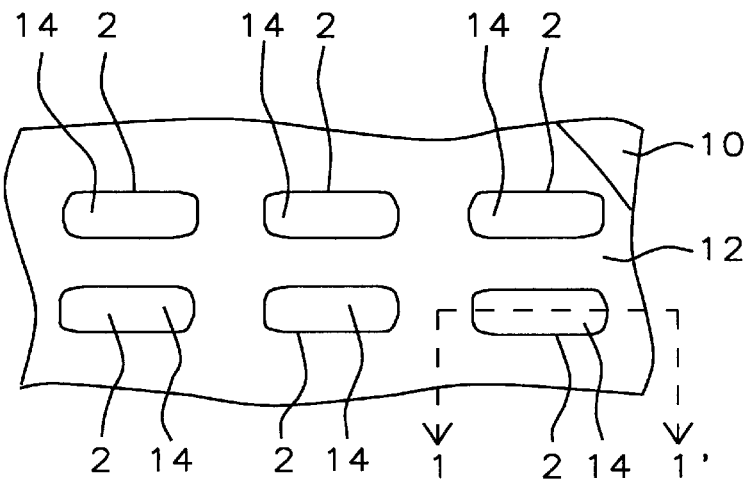
FIG. 1 shows a schematic top view for the layout for the partially completed buried reservoir capacitors for a portion of an array of DRAM cells after forming the $N^+$ doped regions.

Referring first to FIG. 1, a top view is shown of a portion of the array of partially completed DRAM cells in and on a silicon substrate 10 having a photoresist implant mask 12 on the substrate surface. The photoresist mask 12 is formed with an array of openings 2 in which the buried reservoir capacitors are to be formed. Also depicted in FIG. 1 is an array of $N^+$ doped regions 14 formed in the substrate 10 by ion implantation. Although the array of memory cells is formed concurrently, only a cross section through one of the cell areas 1–1' of FIG. 1 is shown in FIGS. 2–8 to simplify the drawings and discussion.

Figure 2:
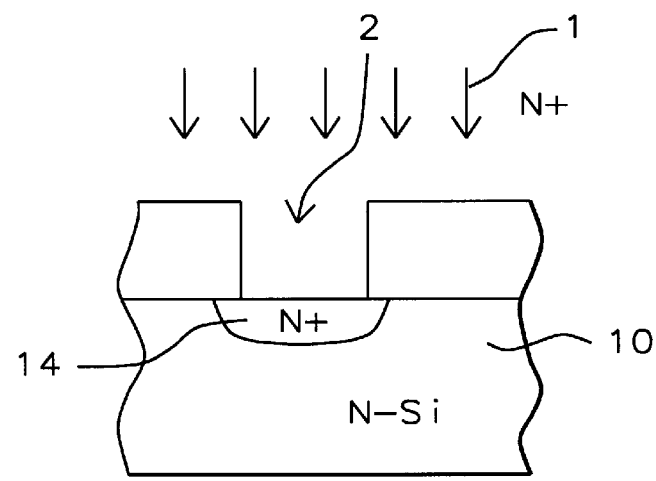
FIGS. 2 through 8 show schematic cross-sectional views of the present invention for the sequence of process steps making an array of DRAM cells having the array of novel buried reservoir capacitors.

Referring to FIG. 2, the method for the buried reservoir capacitor begins by providing an N doped semiconductor substrate 10. The substrate 10 is preferably a single-crystal silicon substrate that is N type conductively doped with arsenic having a dopant concentration of between about 1.0 E 15 and 1.0 E 18 atoms/cm$^3$. Typically the substrate has a thermal oxide (not shown) formed on the surface to provide a better adhesion surface for the photoresist and to prevent surface contamination. The first photoresist layer 12 is deposited by spin coating and is patterned to form an array of openings 2, one of which is shown in FIG. 2. A $N^+$ ion implantation 1 is carried out to form a heavily doped $N^+$ region 14 in the opening 2. The preferred implantation is arsenic (As$^{75}$) and is implanted to have a final concentration of between about 1.0 E 18 and 1.0 E 21 atoms/cm$^3$. Alternatively, a phosphorus (P$^{31}$) ion implantation can be used for the doped region 14, also having a concentration of between about 1.0 E 18 and 1.0 E 21 atoms/cm$^3$.

Figure 3:
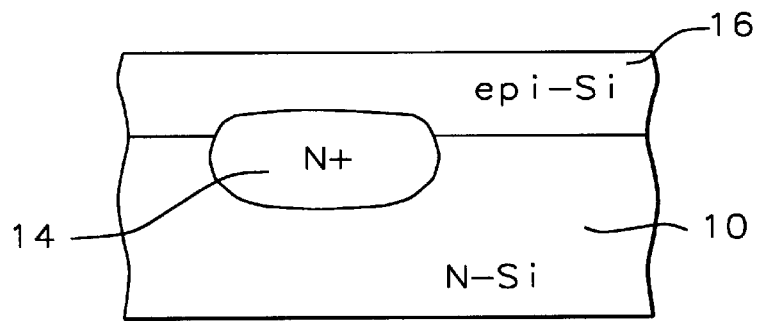

Referring to FIG. 3, the first photoresist implant mask is removed, and the thermal oxide on the substrate surface is also removed. The substrate is then subjected to a drive-in step in an oxidizing ambient to activate the implanted impurities and to anneal out any implant damage, as is commonly used for forming the subcollectors in bipolar transistor technology. Simultaneously, a new oxide is grown on the substrate surface that grows faster over the $N^+$ regions 14 and therefore provides steps in the silicon substrate. The new oxide is then removed, and the steps in the substrate propagate up through the subsequent epitaxy layer and serve as alignment marks to the buried $N^+$ region 14. The detailed steps for growing the new oxide and the alignment marks are not explicitly depicted in FIG. 3.

Still referring to FIG. 3, a silicon epitaxy layer 16 is then grown on the substrate. Preferably the epitaxial layer is grown by chemical vapor deposition (CVD) using a gas mixture such as dichlorosilane (SiH$_2$Cl$_2$) and hydrogen (H$_2$) and at a temperature of about 1050 to 1150° C. The epitaxial layer 16 is undoped, and is grown to a thickness of between about 1000 and 9000 Angstroms.

Figure 4:
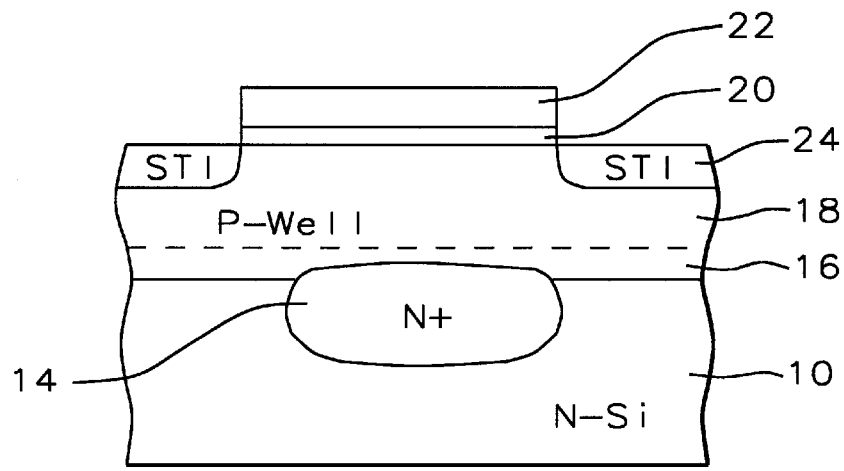

Referring to FIG. 4, a patterned second photoresist mask (not shown) is used to form P-wells 18 in the silicon epitaxy layer 16 aligned over the $N^+$ doped regions 14. Preferably the P-wells are formed by implanting boron difluoride (BF$_2$) or boron (B) that results in a final concentration of between about 1.0 E 17 and 1.0 E 19 atoms/cm$^3$, and a depth of between about 0.1 and 0.5 micrometers (um).

The second photoresist implant mask is then removed, and a pad oxide 20 and a silicon nitride (Si$_3$N$_4$) layer 22 are formed on the substrate. Preferably the pad oxide 20 is formed by thermal oxidation to a thickness of between about 70 and 400 Angstroms. The Si$_3$N$_4$ layer 22 is deposited by low pressure chemical vapor deposition (LPCVD) using a gas mixture of SiCl$_2$H$_2$ and ammonia (NH$_3$), and can be deposited at a temperature of about 700 to 800° C. The Si$_3$N$_4$ layer 22 is deposited to a thickness of between about 1500 and 2500 Angstroms. Conventional photolithographic techniques and anisotropic plasma etching are used to form open areas in the Si$_3$N$_4$ where Field OXide (FOX) isolation regions are required. The field oxide isolation regions 24 are then formed surrounding and electrically isolating device areas which are aligned over the $N^+$ doped regions 14. For example, the FOX 24 can be formed by the conventional LOCal Oxidation of Silicon (LOCOS) method using the patterned Si$_3$N$_4$ layer 22 that remains over the device areas as an oxidation barrier mask. Alternatively, it is more desirable to use a more advanced planar isolation technique, such as shallow trench isolation (STI), to improve DRAM cell density, as depicted in FIG. 4. For example, one method of forming the STI 24 is by etching a trench in the epitaxial layer 16 (or P-well 18), which is thermally oxidized, filled with a CVD silicon oxide ($SiO_2$), and polished back to the $Si_3N_4$ layer.

Figure 5:
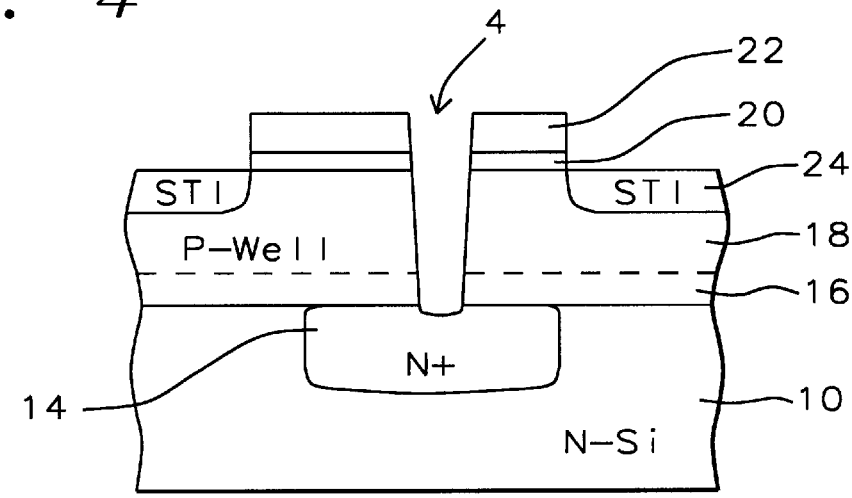

Now as shown in FIG. 5, holes 4 are etched in the device areas using conventional photolithographic techniques and anisotropic plasma etching. The holes are etched through the $Si_3N_4$ layer 22, the pad oxide layer 20, and the P-wells 18 in the silicon epitaxy layer 16 down to the $N^+$ doped regions 14. Preferably the anisotropic etching is carried out in a high-density plasma (HDP) etcher using an etchant gas mixture such as $CCl_2F_2$, $CHF_3$, or $CF_4$ and $H_2$ to etch through the $Si_3N_4$ layer, and an etchant gas mixture such as $CF_3Br$ or HBr and $NF_3$ for etching through the epitaxial layer to the $N^+$ doped region 14.

Figure 6:
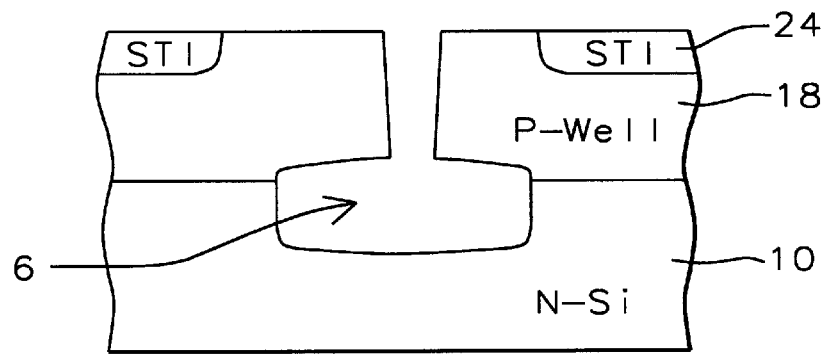

Referring now to FIG. 6, a key feature of the invention is the selective removal of the $N^+$ doped region 14 by dry etching to form a cavity 6 under the device area for the buried reservoir capacitor, thereby providing increased capacitance, while minimizing the area that the memory cell occupies on the substrate. The heavily doped $N^+$ region etches more rapidly than the lightly doped N substrate, therefore the cavity 6 is formed without significantly overetching into the substrate. Preferably the isotropic dry etching is carried out in a plasma etchant gas such as chlorine ($Cl_2$) for a time of about 5 and 10 minutes. For this plasma ion etching, the etch rate selectivity between the $N^+$ doped region and the substrate is about 10:1. The $Si_3N_4$ layer 22 is then removed by wet etching in a hot phosphoric acid solution.

Figure 7:
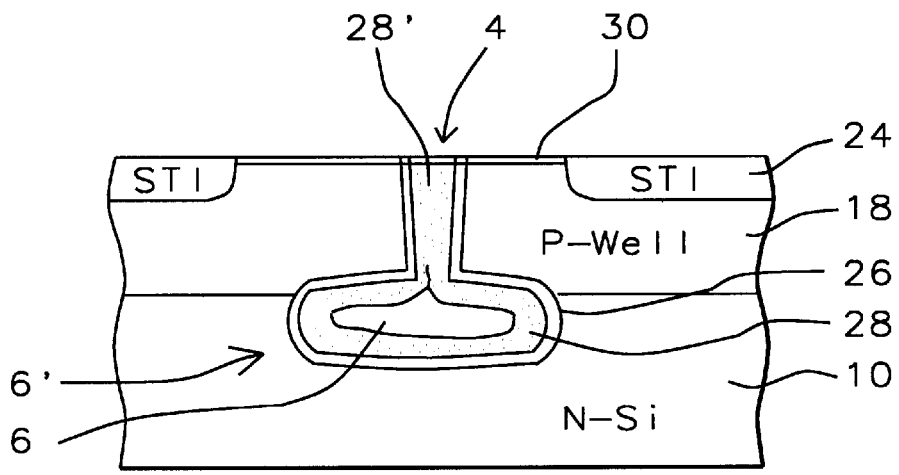
Figure 8:
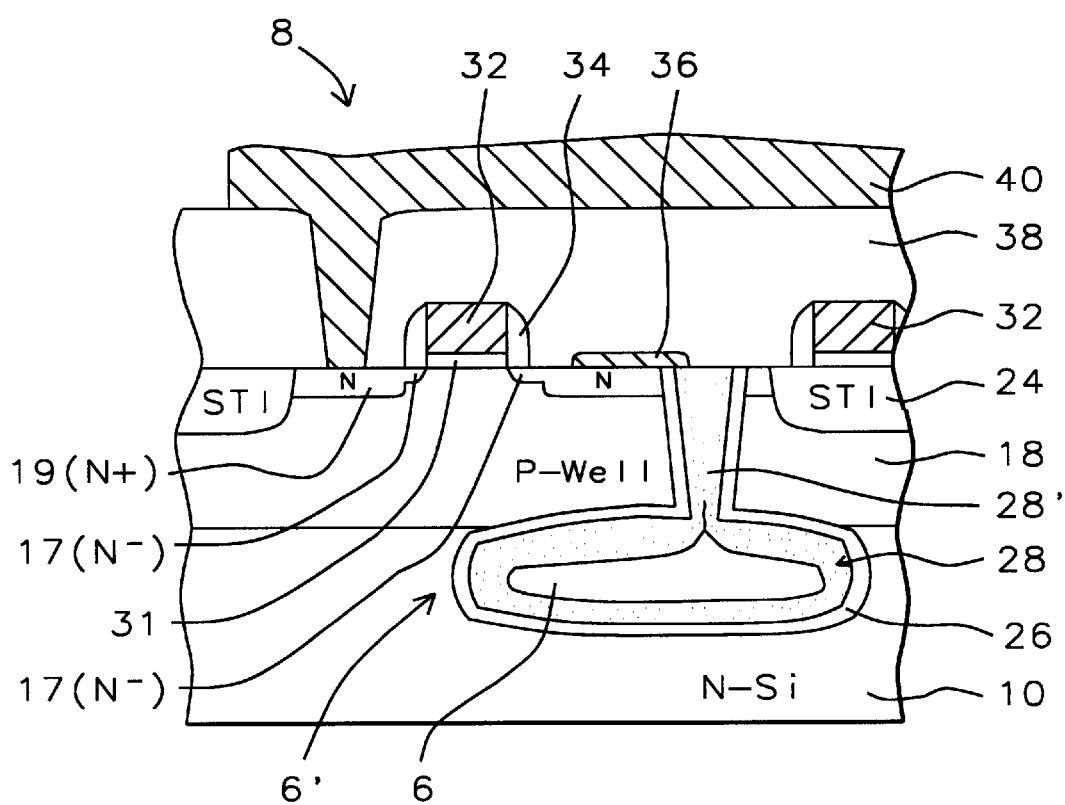

Referring next to FIG. 7, a thin capacitor insulating layer 26 having a high dielectric constant is deposited to form an interelectrode dielectric layer on the surface of the substrate in the cavity 6 and on the sidewalls of the hole 4. Preferably layer 26 is composed of a multilayer of $SiO_2/Si_3N_4/SiO_2$ (ONO). For example, the ONO can be formed by thermally oxidizing the substrate surface in the cavity 6, depositing a CVD $Si_3N_4$, followed by a reduction in oxygen to convert the exposed $Si_3N_4$ surface to a $SiO_2$. The preferred thickness of layer 26 is between about 30 and 50 Angstroms. Alternatively, other high dielectric constant materials, such as tantalum pentoxide ($Ta_2O_5$) can be used in place of the ONO. Other high-dielectric materials that can be used include $SrBi_2Ta_2O_9$ (SBT) or $(Ba,Sr)TiO_3$ (BST).

Continuing with FIG. 7, a doped polysilicon layer 28 is deposited on the interelectrode dielectric layer 26 on the substrate surface in the cavity 6 and to fill the hole 4. Preferably polysilicon layer 28 is deposited by LPCVD using a reactant gas such as silane ($SiH_4$), and is in-situ conductively doped with an N-type impurity such as with phosphorus or arsenic. Preferably layer 28 is doped to a concentration of between about 1.0 E 19 and 1.0 E 21 atoms/cm$^3$. Layer 28 is deposited to a thickness sufficient to fill the hole 4. By way of example only, if the hole is 0.2 micrometers (mu) in width or diameter, then a conformal polysilicon layer would be deposited to a thickness of at least greater than 1000 Angstroms (0.1 um). The polysilicon layer 28 is then chemically/mechanically polished (CMP) back to the substrate surface thereby forming an anode electrode composed of layer 28 in the cavity 6, and an anode contact 28' in the opening 4 to complete the buried reservoir capacitor 6'. Optionally a sacrificial oxide 30 can be thermally grown and removed to eliminate any substrate damage in the device area due to CMP. Alternatively, layer 28 can be composed of other electrically conductive materials that can be deposited by CVD, such as tungsten (W), to form this conformal layer as the capacitor node layer.

Referring to FIG. 8, the partially completed DRAM structure having the array of buried reservoir capacitors is further processed to form a high-density array of DRAM cells. Continuing, as shown for one of the memory cell areas, a gate oxide 31 is grown on the device area. Preferably the gate oxide is grown to a thickness of between about 30 and 80 Angstroms. A first polycide layer 32 is deposited and patterned using conventional photolithographic techniques and anisotropic plasma etching to form the gate electrodes 32 for the field effect transistors (FETs). Preferably the polycide is formed by depositing an $N^+$ doped polysilicon by LPCVD using $SiH_4$, followed by the deposition of a tungsten silicide ($WSi_2$) or titanium silicide ($TiSi_2$). The $WSi_2$ can be deposited by LPCVD using a reactant gas mixture such as tungsten hexafluoride ($WF_6$) and $SiH_4$, and the $TiSi_2$ can be deposited by sputter deposition. Preferably layer 32 is between about 800 and 2500 Angstroms thick. The gate electrodes are formed on the device areas and extend over the buried reservoir capacitors 6', thereby providing increased capacitance while minimizing cell area. The buried reservoir capacitor 6' can also be formed under the shallow trench isolation region 24, thereby allowing the cell area to be further reduced. The patterned first polycide layer 32 also forms word lines (also labeled 32) over the field oxide isolation regions 24. Next, lightly doped source/drain areas 17($N^-$) are formed adjacent to the gate electrodes 32 by ion implantation, for example by implanting $As^{75}$. A conformal insulating layer is deposited and anisotropically etched back to form sidewall spacers 34 on the gate electrodes 32. Next, source/drain contact areas 19($N^+$) are formed adjacent to the sidewall spacers 34 by ion implantation to complete the FETs (access transistors) for the array of DRAM cells. For example, the source/drain contact areas 19(N+) can also be formed by implanting $As^{75}$ ions to form heavily doped contact regions in the substrate 10 to provide low contact resistance.

Still referring to FIG. 8, a conducting layer 36 is deposited and patterned to form a node strap over the capacitor insulating layer 26 (interelectrode dielectric) to form a good electrical contact between one of the FET source/drain contact areas 19($N^+$) and the capacitor anode electrical contact 28'. The node strap 36 is preferably composed of a good conductor, such as $TiSi_2$, $CoSi_2$ or TiN, and is deposited by sputtering to a thickness of between about 100 and 800 Angstroms. The strap is patterned using photolithography and plasma etching. For example, the strap can be etched in an etchant gas such as $CCl_2F_2$ or $CF_4/Cl_2$. Alternatively the strap can be formed by wet etching or by self-aligned silicidation methods as commonly practiced in the industry.

The FET gate electrodes 32 and the source/drain contact areas 19($N^+$) are then electrically insulated by depositing a polysilicon/metal dielectric (PMD) layer 38. Preferably the PMD layer 38 is a CVD silicon oxide or a low temperature glass, such as a borophosphosilicate glass (BPSG) having a low glass-reflow temperature. The PMD can then be leveled by using a reflow anneal. Alternatively layer 38 can be globally planarized by chemical/mechanical polishing. Typically after planarization, the PMD layer 38 has a thickness of between about 5000 and 12000 Angstroms. Bit line contact holes 8 are etched in the PMD layer 38 to the second of the source/drain contact areas 19($N^+$) of each FET. A second polycide layer 40 is deposited and patterned using conventional photolithographic techniques and anisotropic plasma etching to form the bit lines (also labeled 40) to complete the array of DRAM cells having improved circuit density. Preferably, the second polycide layer 40 is composed of a multilayer of N+ doped polysilicon and a refractory metal silicide, such as $WSi_2$, and is formed and patterned similar to the first polycide layer 32.

While the invention has been particularly shown and described with reference to the preferred embodiment thereof, it will be understood by those skilled in the art that various changes in form and details may be made without departing from the spirit and scope of the invention.

What is claimed is:

1. A method of manufacturing an array of buried reservoir capacitors in a silicon substrate for an array of dynamic random access memory (DRAM) cells comprising the steps of:

forming a first photoresist implant mask having an array of openings on said silicon substrate;

forming N+ doped regions in said silicon substrate in said openings by ion implantation while said first photoresist implant mask prevents ion implantation elsewhere in said silicon substrate;

removing said first photoresist implant mask;

growing a silicon epitaxy layer on said silicon substrate;

forming an array of P-wells in said silicon epitaxy layer over said N+ doped regions by using a patterned second photoresist implant mask;

removing said second photoresist implant mask;

depositing a pad oxide and a silicon nitride layer and forming open areas in said silicon nitride layer in which field oxide isolation regions are required;

forming said field oxide isolation regions surrounding and electrically isolating device areas, said device areas aligned over said N+ doped regions;

anisotropically etching holes in said device areas through said silicon nitride layer and said P-wells in said silicon epitaxy layer to said N+ doped regions;

isotropically and selectively etching in said holes and thereby removing said N+ doped regions, and forming cavities in said silicon substrate;

removing said silicon nitride layer by etching;

depositing an interelectrode dielectric layer on surface of said cavities and on sidewalls of said holes;

depositing a doped polysilicon layer on said interelectrode dielectric layer on said surface of said cavities and filling said holes, said doped polysilicon layer in said holes forming anode electrical contacts for said buried reservoir capacitors;

chemical/mechanically polishing back said doped polysilicon layer to surface of said substrate, thereby completing said array of buried reservoir capacitors.

2. The method of claim 1, wherein said silicon substrate is a single crystal silicon conductively doped N-type with arsenic to a concentration of between about 1.0 E 15 and 1.0 E 18 atoms/$cm^3$.

3. The method of claim 1, wherein said N+ doped regions are heavily doped with arsenic (As) to a concentration of between about 1.0 E 18 and 1.0 E 21 atoms/$cm^3$.

4. The method of claim 1, wherein said N+ doped regions are heavily doped with phosphorus (P) to a concentration of between about 1.0 E 18 and 1.0 E 21 atoms/$cm^3$.

5. The method of claim 1, wherein said silicon epitaxy layer is deposited by chemical vapor deposition (CVD) using dichlorosilane ($SiCl_2H_2$) as the reactant gas.

6. The method of claim 1, wherein said silicon epitaxy layer is deposited to a thickness of between about 1000 and 9000 Angstroms.

7. The method of claim 1, wherein said P-wells are doped with boron (B) to a concentration of between about 1.0 E 17 and 1.0 E 19 atoms/$cm^3$.

8. The method of claim 1, wherein said field oxide isolation regions are formed by thermal oxidation of said silicon epitaxy layer by the conventional LOCal Oxidation of Silicon (LOCOS) method.

9. The method of claim 1, wherein said field oxide isolation regions are formed using a shallow trench isolation (STI) method.

10. The method of claim 1, wherein said isotropic and selective etching of said N+ doped regions is carried out using plasma etching in a chlorine gas.

11. The method of claim 1, where in said interelectrode layer is composed of a silicon oxide-silicon nitride-silicon oxide (ONO) having a thickness of between about 30 and 50 Angstroms.

12. The method of claim 1, wherein said doped polysilicon layer is deposited to a thickness sufficient to completely fill said holes in said silicon epitaxy layer.

13. A method of manufacturing an array of dynamic random access memory (DRAM) cells having an array of buried reservoir capacitors on and in a silicon substrate comprising the steps of:

forming a first photoresist implant mask having an array of openings on said silicon substrate;

forming N+ doped regions in said silicon substrate in said openings by ion implantation while said first photoresist implant mask prevents ion implantation elsewhere in said silicon substrate;

removing said first photoresist implant mask;

growing a silicon epitaxy layer on said silicon substrate;

forming an array of P-wells in said silicon epitaxy layer over said N+ doped regions by using a patterned second photoresist implant mask;

removing said second photoresist implant mask;

depositing a pad oxide and a silicon nitride layer and forming open areas in said silicon nitride layer in which field oxide isolation regions are required;

forming said field oxide isolation regions surrounding and electrically isolating device areas, said device areas aligned over said N+ doped regions;

anisotropically etching holes in said device areas through said silicon nitride layer and said P-wells in said silicon epitaxy layer to said N+ doped regions;

isotropically and selectively etching in said holes and thereby removing said N+ doped regions, and forming cavities in said silicon substrate;

removing said silicon nitride layer by etching;

depositing an interelectrode dielectric layer on surface of said cavities and on sidewalls of said holes;

depositing a doped polysilicon layer on said interelectrode dielectric layer on said surface of said cavities and filling said holes, said doped polysilicon layer in said holes forming anode electrical contacts for said buried reservoir capacitors;

chemical/mechanically polishing back said doped polysilicon layer to surface of said substrate, thereby completing said array of buried reservoir capacitors;

and further, forming said array of DRAM cells by, growing a gate oxide on said device areas;

depositing and patterning a first polycide layer forming field effect transistor (FET) gate electrodes on said device areas extending over said buried reservoir capacitors, and concurrently forming word lines over said field oxide isolation regions;

forming lightly doped source/drain areas adjacent to said gate electrodes by ion implantation;

depositing and etching back a conformal insulating layer and forming sidewall spacers on said gate electrodes;

forming source/drain contact areas adjacent to said sidewall spacers by ion implantation to form FET access transistors for said array of DRAM cells, one of said source/drain areas of each said transistor extending over one of said anode electrical contacts of said buried reservoir capacitors;

depositing and patterning a conducting layer to form a node strap over said interelectrode dielectric layer to form an electrical connection between said source/drain area and said anode electrical contact;

depositing a polysilicon/metal dielectric (PMD) layer to insulate said FET gate electrodes and said source/drain areas;

etching bit line contact holes in said polysilicon/metal dielectric layer to second of said source/drain areas of each of said FETs;

depositing and patterning a second polycide layer to form bit lines extending over and in said bit line contact holes, thereby completing said array of DRAM cells.

14. The method of claim 13, wherein said silicon substrate is a single crystal silicon conductively doped N-type with arsenic to a concentration of between about $1.0 \text{ E } 15$ and $1.0 \text{ E } 18$ atoms/cm$^3$.

15. The method of claim 13, wherein said N$^+$ doped regions are heavily doped with arsenic (As) to a concentration of between about $1.0 \text{ E } 18$ and $1.0 \text{ E } 21$ atoms/cm$^3$.

16. The method of claim 13, wherein said N$^+$ doped regions are heavily doped with phosphorus (P) to a concentration of between about $1.0 \text{ E } 18$ and $1.0 \text{ E } 21$ atoms/cm$^3$.

17. The method of claim 13, wherein said silicon epitaxy layer is deposited by chemical vapor deposition (CVD) using dichlorosilane (SiCl$_2$H$_2$) as the reactant gas.

18. The method of claim 13, wherein said silicon epitaxy layer is deposited to a thickness of between about 1000 and 9000 Angstroms.

19. The method of claim 13, wherein said P-wells are doped with boron (B) to a concentration of between about $1.0 \text{ E } 17$ and $1.0 \text{ E } 19$ atoms/cm$^3$.

20. The method of claim 13, wherein said field oxide isolation regions are formed by thermal oxidation of said silicon epitaxy layer by the conventional LOCal Oxidation of Silicon (LOCOS) method.

21. The method of claim 13, wherein said field oxide isolation regions are formed using a shallow trench isolation (STI) method.

22. The method of claim 13, wherein said isotropic and selective etching of said N$^+$ doped regions is carried out using plasma etching in a chlorine gas.

23. The method of claim 13, wherein said interelectrode layer is composed of a silicon oxide-silicon nitride-silicon oxide (ONO) having a thickness of between about 30 and 50 Angstroms.

24. The method of claim 13, wherein said interelectrode dielectric layer is composed of tantalum pentoxide (Ta$_2$O$_5$).

25. The method of claim 13, wherein said doped polysilicon layer is deposited to a thickness sufficient to completely fill said holes in said silicon epitaxy layer.

26. The method of claim 13, wherein said node strap is composed of a material from the group that includes titanium silicide, cobalt silicide, and titanium nitride, and is deposited to a thickness of between about 100 and 800 Angstroms.

* * * * *